United States Patent
Lo

(10) Patent No.: US 7,960,976 B1
(45) Date of Patent: *Jun. 14, 2011

(54) ADVANCED TIME DOMAIN REFLECTION CABLE TESTING

(75) Inventor: William Lo, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 12/723,122

(22) Filed: Mar. 12, 2010

Related U.S. Application Data

(63) Continuation of application No. 11/254,147, filed on Oct. 19, 2005, now Pat. No. 7,679,371.

(60) Provisional application No. 60/685,523, filed on May 27, 2005, provisional application No. 60/695,177, filed on Jun. 28, 2005.

(51) Int. Cl.
*G01R 31/11* (2006.01)

(52) U.S. Cl. ........ 324/533; 324/616; 324/628; 324/710; 370/252

(58) Field of Classification Search ............. 324/533
See application file for complete search history.

(56) References Cited

U.S. PATENT DOCUMENTS

| | | | |
|---|---|---|---|
| 4,739,276 A | 4/1988 | Graube | |
| 4,914,394 A | 4/1990 | Meyer | |
| 4,970,466 A | 11/1990 | Bolles et al. | |
| 5,420,512 A | 5/1995 | Spillane et al. | |
| 5,440,528 A | 8/1995 | Walsh | |
| 5,461,318 A | 10/1995 | Borchert et al. | |
| 5,521,512 A | 5/1996 | Hulina | |
| 5,530,367 A * | 6/1996 | Bottman | 324/616 |
| 5,570,028 A | 10/1996 | Sperlazzo et al. | |
| 5,821,760 A * | 10/1998 | Koeman et al. | 324/628 |
| 6,138,080 A | 10/2000 | Richardson | |
| 6,198,727 B1 | 3/2001 | Wakeley et al. | |
| 6,259,258 B1 * | 7/2001 | Cook et al. | 324/628 |
| 6,377,640 B2 | 4/2002 | Trans | |
| 6,434,716 B1 | 8/2002 | Johnson et al. | |
| 6,448,899 B1 | 9/2002 | Thompson | |
| 6,522,152 B1 | 2/2003 | Tonti et al. | |

(Continued)

FOREIGN PATENT DOCUMENTS

WO  WO 0011861  3/2000

(Continued)

OTHER PUBLICATIONS

U.S. Appl. No. 60/217,418, filed Jul. 2000, Lam.

(Continued)

*Primary Examiner* — Timothy J Dole
*Assistant Examiner* — Benjamin M Baldridge

(57) ABSTRACT

A cable testing system that tests cable includes a pulse generation module that transmits a first pulse on a first communications channel of the cable. A sampling module waits a predetermined time period after the pulse generation module transmits the first pulse and then detects a first amplitude of a reflected signal on a second communications channel of the cable. A time domain reflection (TDR) module receives the first amplitude and verifies proper operation of the cable based on the first amplitude. The predetermined time period corresponds with an estimated roundtrip propagation delay of the first pulse when the first pulse is reflected back to the cable testing system after traveling a first predetermined distance along the cable. The sampling module incrementally increases the predetermined time period during subsequent iterations of a cable test in order to verify proper operation of a predetermined segment of the cable.

22 Claims, 10 Drawing Sheets

U.S. PATENT DOCUMENTS

| | | |
|---|---|---|
| 6,535,983 B1 | 3/2003 | McCormack et al. |
| 6,694,017 B1 | 2/2004 | Takada |
| 6,728,216 B1 | 4/2004 | Sterner |
| 6,748,016 B1 * | 6/2004 | Tzannes .................. 375/227 |
| 6,775,529 B1 | 8/2004 | Roo |
| 6,819,744 B1 * | 11/2004 | Banwell et al. ............ 379/1.01 |
| 6,825,672 B1 | 11/2004 | Lo et al. |
| 6,829,223 B1 | 12/2004 | Richardson et al. |
| 6,977,507 B1 | 12/2005 | Pannell et al. |
| 6,980,007 B1 | 12/2005 | Lo et al. |
| 6,982,557 B1 | 1/2006 | Lo et al. |
| 6,992,491 B1 | 1/2006 | Lo et al. |
| 6,995,551 B1 | 2/2006 | Lo et al. |
| 7,002,353 B1 | 2/2006 | Lo et al. |
| 7,002,354 B1 | 2/2006 | Pannell et al. |
| 7,005,861 B1 | 2/2006 | Lo et al. |
| 7,012,436 B1 | 3/2006 | Pannell et al. |
| 7,019,533 B1 | 3/2006 | Lo et al. |
| 7,026,825 B1 | 4/2006 | Lo et al. |
| 7,068,043 B1 | 6/2006 | Lo et al. |
| 7,068,044 B1 | 6/2006 | Lo et al. |
| 7,068,611 B2 * | 6/2006 | Bui ........................... 370/252 |
| 7,075,283 B1 | 7/2006 | Lo et al. |
| 7,127,481 B1 | 10/2006 | Lam |
| 7,173,431 B1 | 2/2007 | Lo et al. |
| 7,190,172 B1 | 3/2007 | Lo et al. |
| 7,203,851 B1 | 4/2007 | Lo et al. |
| 7,276,913 B1 | 10/2007 | Lo et al. |
| 7,624,197 B1 | 11/2009 | Lo |
| 2002/0124110 A1 | 9/2002 | Tanaka |
| 2003/0163272 A1 | 8/2003 | Kaburlasos et al. |
| 2004/0019443 A1 | 1/2004 | Jones et al. |
| 2004/0136463 A1 * | 7/2004 | Tzannes ..................... 375/257 |

FOREIGN PATENT DOCUMENTS

| | | |
|---|---|---|
| WO | WO 0111861 A2 | 2/2001 |
| WO | WO 0111861 A3 | 2/2001 |

OTHER PUBLICATIONS

Intel, LXT9784 Octal 10/100 Transceiver Hardware Integrity Function Overview; Jan. 2001; 13 pages.

Movable Tap Finite Impulse Response Filter; 36 pages; Oct. 14, 2000.

Patent Application; Method and Apparatus for Detecting and Supplying Power by a First Network Device to a Second Network Device; 52 pages; Mar. 16, 2002.

Apparatus and Method for Automatic Speed Downshift for a Two Pair Cable; 56 pages; Nov. 21, 2001.

IEEE Std 802.3-2002, Section Three; Carrier Sense Multiple Access with Collision Detection (CSMA/CD) access method and physical layer specifications; 379 pages; 2002 © IEEE.

Agilent 8510C Network Analyzer Data Sheet, Agilent Technologies, Inc. © Agilent Technologies, 1999, 2000, Printed Jun. 2000.

Introduction to New Features, Agilent Technologies 8510C Network Analyzer, Revision 7.XX, Agilent Technologies, Inc., Part No. 11575-90024, Mar. 1995.

* cited by examiner ial application Ser. No. 11/254,147, filed Oct. 19, 2005, which claims
ADVANCED TIME DOMAIN REFLECTION CABLE TESTING

CROSS-REFERENCE TO RELATED APPLICATIONS

This application is a continuation of U.S. patent application Ser. No. 11/254,147, filed Oct. 19, 2005, which claims the benefit of U.S. Provisional Application Nos. 60/685,523, filed May 27, 2005, and 60/695,177, filed Jun. 28, 2005, which are all hereby incorporated by reference in their entirety.

FIELD OF THE INVENTION

The present invention relates to electronic diagnostic systems, and more particularly to testing equipment for cable used in a network.

BACKGROUND OF THE INVENTION

One goal of a network manager is to control total cost of ownership of the network. Cabling problems can cause a significant amount of network downtime and can require troubleshooting resources, which increase the total cost of ownership. Providing tools that help solve cabling problems more quickly will increase network uptime and reduce the total cost of ownership.

Referring now to FIG. 1, conventional cable testers 10 are frequently used to isolate cabling problems. The cable testers 10 are coupled by a connector 12 (such as an RJ-45 or other connector) to a cable 14. A connector 15 connects the cable 14 to a load 16. Conventional cable testers 10 typically require the load 16 to be a remote node terminator or a loop back module. Conventional cable tests may generate inaccurate results when the cable 14 is terminated by an active link partner that is generating link pulses during a test. The cable tester 10 performs cable analysis and is able to detect a short, an open, a crossed pair, or a reversed pair. The cable tester 10 can also determine a cable length to a short or open.

A short condition occurs when two or more lines are short-circuited together. An open condition occurs when there is a lack of continuity between ends at both ends of a cable 14. A crossed pair occurs when a pair is connected to different pins at each end. For example, a first pair is connected to pins 1 and 2 at one end and pins 3 and 6 at the other end. A reversed pair occurs when two ends in a pair are connected to opposite pins at each end of the cable 14. For example, a line on pin 1 is connected to pin 2 at the other end. A line on pin 2 is connected to pin 1 at the other end.

The cable tester 10 employs time domain reflection (TDR), which is based on transmission line theory, to troubleshoot cable faults. The cable tester 10 transmits a pulse 17 on the cable 14 and measures an elapsed time until a reflection 18 is received. Using the elapsed time and a cable propagation constant, a cable distance can be estimated and a fault can be identified. Two waves propagate through the cable 14. A forward wave propagates from a transmitter in the cable tester 10 towards the load 16 or fault. A return wave propagates from the load 16 or fault to the cable tester 10.

A perfectly terminated line has no attenuation and an impedance that is matched to a source impedance. The load is equal to the line impedance. The return wave is zero for a perfectly terminated line because the load receives all of the forward wave energy. For open circuits, the return wave has an amplitude that is approximately equal to the forward wave. For short circuits, the return wave has a negative amplitude and is also approximately equal to the forward wave.

In transmission line theory, a reflection coefficient is defined as $$T_L = \frac{R\_wave}{F\_wave} = \frac{V_-}{V_+} = \frac{Z_L - Z_O}{Z_L + Z_O},$$

where $Z_L$ is the load impedance and $Z_O$ is the cable impedance. The return loss in (dB) is defined as $$R_L(db) = 20\mathrm{LOG}_{10}\left|\frac{1}{T_L}\right| = 20\mathrm{LOG}_{10}\left|\frac{Z_L + Z_O}{Z_L - Z_O}\right|.$$

Return loss performance is determined by the transmitter return loss, the cable characteristic impedance and return loss, and the receiver return loss. IEEE section 802.3, which is hereby incorporated by reference, specifies receiver and transmitter minimum return loss for various frequencies. Additional factors that may affect the accuracy of the return loss measurement include connectors and patch panels. Cable impedance can also vary, for example CAT5 UTP cable impedance can vary±15 Ohms.

While conventional cable testers 10 are capable of detecting the locations of faults on cables 14, conventional cable testers 10 typically only report the time at which a maximum amplitude of a reflection 18 is detected. For example, a cable 14 may include multiple faults that each individually contribute to the reflection 18. Additionally, it may be useful for a network manager to observe data regarding an entire reflection 18 and not just the location of an individual fault within the reflection 18. Conventional cable testers 10 are also typically required to disable active links between the cable tester 10 and link partners that communicate through the cable 14. Disabling active links increases network downtime and increases the duration of cable tests.

SUMMARY OF THE INVENTION

A cable testing system that tests cable according to the present invention includes a pulse generation module that transmits a first pulse on a first communications channel of the cable. A sampling module waits a predetermined time period after the pulse generation module transmits the first pulse and then detects a first amplitude of a reflected signal on a second communications channel of the cable. A time domain reflection (TDR) module receives the first amplitude and verifies proper operation of the cable based on the first amplitude. The predetermined time period corresponds with an estimated roundtrip propagation delay of the first pulse when the first pulse is reflected back to the cable testing system after traveling a first predetermined distance along the cable.

In other features, the first and second communications channels are the same communications channel. Alternatively, the first and second communications channels are different communications channels. The pulse generation module transmits a second pulse that is equal to the first pulse on the first communications channel. The sampling module detects a second amplitude of a reflected signal on the second communications channel after waiting the predetermined time period after the pulse generation module transmits the second pulse. The TDR module receives the second amplitude, generates an averaged amplitude by averaging the first and second amplitudes, and verifies proper operation of the cable based on the averaged amplitude.

In still other features of the invention, a media detection module detects a configuration of media with which the cable testing system currently communicates. The sampling module incrementally increases the predetermined time period during subsequent iterations of a cable test in order to verify proper operation of a predetermined segment of the cable. The sampling module sets the predetermined time period equal to zero during a first iteration of a cable test and incrementally increases the predetermined time period during subsequent iterations of the cable test to a maximum time period corresponding with a length of the cable in order to verify proper operation of the cable.

In yet other features, before the pulse generation module transmits the first pulse, the TDR module determines an offset value associated with a level of constant noise on the second communications channel and subtracts the offset value from the first amplitude before verifying proper operation of the cable based on the first amplitude. The TDR module utilizes a previously stored offset value when a difference between a current offset value and the previously stored offset value is greater than a rejection threshold. The pulse generation module retransmits the second pulse and the sampling module redetects the second amplitude when a difference between the first and second amplitudes is greater than a rejection threshold.

In still other features of the invention the TDR module increments a sample fail counter when the pulse generation module retransmits any pulse. The TDR module declares a current cable test as failed when a value of the sample fail counter is greater than a predetermined count. The TDR module resets a timer when the pulse generation module transmits the first pulse. The pulse generation module only transmits a subsequent pulse after the timer expires. A maximum value of the timer is associated with a maximum roundtrip propagation delay along the cable. The pulse generation module refrains from transmitting the first pulse when the pulse generation module detects activity on at least one of the first and second communications channels.

In yet other features, the cable testing system enters a first wait state and resets a first timer when the pulse generation module detects activity on the at least one of the first and second communications channels. While the cable testing system is in the first wait state, the TDR module declares a current cable test as failed when the first timer expires. While the cable testing system is in the first wait state, the cable testing system enters a second wait state and resets a second timer when the activity on the at least one of the first and second communications channels subsides. While the cable testing system is in the second wait state, the pulse generation module transmits the first pulse when the second timer expires. While the cable testing system is in the second wait state, the cable testing system returns to the first wait state when the activity on the at least one of the first and second communications channels recurs.

In still other features of the invention, the cable testing system operates in a maximum peak mode. The cable testing system detects a maximum amplitude of the reflected signal and a time corresponding with a distance along the cable at which the maximum amplitude originates during the maximum peak mode. The cable testing system operates in a first peak mode. The cable testing system detects an earliest occurring peak of the reflected signal after which the amplitude of the reflected signal subsequently decreases by a first predetermined amplitude and detects a time corresponding with a distance along the cable at which the earliest occurring peak originates. The cable testing system operates in a last peak mode. The cable testing system detects a latest occurring peak of the reflected signal after which the amplitude of the reflected signal subsequently decreases by a first predetermined amplitude and detects a time corresponding with a distance along the cable at which the latest occurring peak originates.

In yet other features, the cable testing system operates in an $N^{th}$ peak mode. The cable testing system detects an $N^{th}$ peak of the reflected signal after which the amplitude of the reflected signal subsequently decreases by a first predetermined amplitude and detects a time corresponding with a distance along the cable at which the $N^{th}$ peak originates. A waveform reconstruction system comprises the cable testing system and further comprises a waveform reconstruction module that receives a plurality of amplitudes of the reflected signal and times at which respective ones of the plurality of amplitudes occur from the TDR module while the sampling module incrementally increases the first predetermined time period from zero to the maximum time period. The waveform reconstruction module generates a reconstructed reflection signal based on the plurality of amplitudes and the times at which respective ones of the plurality of amplitudes occur.

In still other features of the invention, during a cable test, the sampling module detects a second amplitude of a reflected signal on the first communications channel and then subsequently detects a third amplitude of a reflected signal on the second communications channel while the pulse generation module transmits pulses on the first communications channel. The sampling module detects a fourth amplitude of a reflected signal on the first communications channel and then subsequently detects a fifth amplitude of a reflected signal on the second communications channel while the pulse generation module transmits pulses on the second communications channel. The cable is compliant with at least one of IEEE 10BASE-T, 100BASE-TX, 1000BASE-T, and 10 GBASE-T standards.

In yet other features, the cable includes first, second, third, and fourth communications channels that are different. For each of the communications channels that the pulse generation module transmits pulses on during a cable test, the sampling module successively detects amplitudes of reflected signals on each of the communications channels. First and second sampling modules simultaneously detect amplitudes of reflected signals on the first and second communications channels, respectively, during a cable test. The cable includes first, second, third, and fourth communications channels that are different. First, second, third, and fourth sampling modules simultaneously detect amplitudes of reflected signals on the first, second, third, and fourth communications channels, respectively, during a cable test.

In still other features of the invention, the predetermined time period is initially set equal to zero. The sampling module subsequently continues to detect a plurality of amplitudes of the reflected signal at a predetermined sampling rate. The TDR module stores the plurality of amplitudes in a memory module. A waveform reconstruction system comprises the cable testing system and further comprises a waveform reconstruction module that receives the plurality of amplitudes and times at which respective ones of the plurality of amplitudes occur from the memory module. The waveform reconstruction module generates a reconstructed reflection signal based on the plurality of amplitudes and the times at which respective ones of the plurality of amplitudes occur.

In yet other features, the cable includes first, second, third, and fourth communications channels that are different. First, second, third, and fourth sampling modules simultaneously detect amplitudes of reflected signals at a predetermined sampling rate on the first, second, third, and fourth communications channels, respectively. A physical layer device comprises the cable testing system. A network interface comprises the physical layer device.

A cable testing system that tests cable according to the present invention includes pulse generating means for transmitting a first pulse on a first communications channel of the cable. Sampling means waits a predetermined time period after the pulse generating means transmits the first pulse and detects a first amplitude of a reflected signal on a second communications channel of the cable. Computing means receives the first amplitude and verifies proper operation of the cable based on the first amplitude. The predetermined time period corresponds with an estimated roundtrip propagation delay of the first pulse when the first pulse is reflected back to the cable testing system after traveling a first predetermined distance along the cable.

In other features, the first and second communications channels are the same communications channel. Alternatively, the first and second communications channels are different communications channels. The pulse generating means transmits a second pulse that is equal to the first pulse on the first communications channel. The sampling means detects a second amplitude of a reflected signal on the second communications channel after waiting the predetermined time period after the pulse generating means transmits the second pulse. The computing means receives the second amplitude, generates an averaged amplitude by averaging the first and second amplitudes, and verifies proper operation of the cable based on the averaged amplitude. Media detecting means detects a configuration of media with which the cable testing system currently communicates.

In still other features of the invention, the sampling means incrementally increases the predetermined time period during subsequent iterations of a cable test in order to verify proper operation of a predetermined segment of the cable. The sampling means sets the predetermined time period equal to zero during a first iteration of a cable test and incrementally increases the predetermined time period during subsequent iterations of the cable test to a maximum time period corresponding with a length of the cable in order to verify proper operation of the cable. Before the pulse generating means transmits the first pulse, the computing means determines an offset value associated with a level of constant noise on the second communications channel and subtracts the offset value from the first amplitude before verifying proper operation of the cable based on the first amplitude. The computing means utilizes a previously stored offset value when a difference between a current offset value and the previously stored offset value is greater than a rejection threshold.

In yet other features, the pulse generating means retransmits the second pulse and the sampling means redetects the second amplitude when a difference between the first and second amplitudes is greater than a rejection threshold. Counting means stores a count value. The computing means increments the counting means when the pulse generating means retransmits any pulse. The computing means declares a current cable test as failed when the count value is greater than a predetermined count. Timing means stores an incrementally decreasing value. The computing means resets the timing means when the pulse generating means transmits the first pulse. The pulse generating means only transmits a subsequent pulse after the incrementally decreasing value is equal to zero.

In still other features of the invention, a maximum value of the incrementally decreasing value is associated with a maximum roundtrip propagation delay along the cable. The pulse generating means refrains from transmitting the first pulse when the pulse generating means detects activity on at least one of the first and second communications channels. First timing means stores an incrementally decreasing value. The cable testing system enters a first wait state and resets the first timing means when the pulse generating means detects activity on the at least one of the first and second communications channels. While the cable testing system is in the first wait state, the computing means declares a current cable test as failed when the incrementally decreasing value is equal to zero. Second timing means stores an incrementally decreasing value. While the cable testing system is in the first wait state, the cable testing system enters a second wait state and resets the second timing means when the activity on the at least one of the first and second communications channels subsides.

In yet other features, while the cable testing system is in the second wait state, the pulse generating means transmits the first pulse when the incrementally decreasing value of the second timing means is equal to zero. While the cable testing system is in the second wait state, the cable testing system returns to the first wait state when the activity on the at least one of the first and second communications channels recurs. The cable testing system operates in a maximum peak mode. The cable testing system detects a maximum amplitude of the reflected signal and a time corresponding with a distance along the cable at which the maximum amplitude originates during the maximum peak mode. Alternatively, the cable testing system operates in a first peak mode. The cable testing system detects an earliest occurring peak of the reflected signal after which the amplitude of the reflected signal subsequently decreases by a first predetermined amplitude and detects a time corresponding with a distance along the cable at which the earliest occurring peak originates.

In still other features of the invention, the cable testing system operates in a last peak mode. The cable testing system detects a latest occurring peak of the reflected signal after which the amplitude of the reflected signal subsequently decreases by a first predetermined amplitude and detects a time corresponding with a distance along the cable at which the latest occurring peak originates. Alternatively, the cable testing system operates in an $N^{th}$ peak mode. The cable testing system detects an $N^{th}$ peak of the reflected signal after which the amplitude of the reflected signal subsequently decreases by a first predetermined amplitude and detects a time corresponding with a distance along the cable at which the $N^{th}$ peak originates.

In yet other features, a waveform reconstruction system comprises the cable testing system and further comprises waveform reconstructing means for receiving a plurality of amplitudes of the reflected signal and times at which respective ones of the plurality of amplitudes occur from the computing means while the sampling means incrementally increases the first predetermined time period from zero to the maximum time period. The waveform reconstructing means generates a reconstructed reflection signal based on the plurality of amplitudes and the times at which respective ones of the plurality of amplitudes occur. During a cable test, the sampling means detects a second amplitude of a reflected signal on the first communications channel and then subsequently detects a third amplitude of a reflected signal on the second communications channel while the pulse generating means transmits pulses on the first communications channel. The sampling means detects a fourth amplitude of a reflected signal on the first communications channel and then subsequently detects a fifth amplitude of a reflected signal on the second communications channel while the pulse generating means transmits pulses on the second communications channel.

In still other features of the invention, the cable is compliant with at least one of IEEE 10BASE-T, 100BASE-TX, 1000BASE-T, and 10 GBASE-T standards. The cable includes first, second, third, and fourth communications channels that are different. For each of the communications channels that the pulse generating means transmits pulses on during a cable test, the sampling means successively detects amplitudes of reflected signals on each of the communications channels. First and second sampling means for sampling a signal simultaneously detect amplitudes of reflected signals on the first and second communications channels, respectively, during a cable test. The cable includes first, second, third, and fourth communications channels that are different. First, second, third, and fourth sampling means for sampling a signal simultaneously detect amplitudes of reflected signals on the first, second, third, and fourth communications channels, respectively, during a cable test.

In yet other features, memory means stores data. The predetermined time period is initially set equal to zero. The sampling means subsequently continues to detect a plurality of amplitudes of the reflected signal at a predetermined sampling rate. The computing means stores the plurality of amplitudes in the memory means. A waveform reconstruction system comprises the cable testing system and further comprises waveform reconstructing means for receiving the plurality of amplitudes and times at which respective ones of the plurality of amplitudes occur from the memory means. The waveform reconstructing means generates a reconstructed reflection signal based on the plurality of amplitudes and the times at which respective ones of the plurality of amplitudes occur. The cable includes first, second, third, and fourth communications channels that are different. Memory means stores data. First, second, third, and fourth sampling means for sampling a signal simultaneously detect amplitudes of reflected signals at a predetermined sampling rate on the first, second, third, and fourth communications channels, respectively. A physical layer device comprises the cable testing system. A network interface comprises the physical layer device.

A method for operating a cable testing system that tests cable according to the present invention includes transmitting a first pulse on a first communications channel of the cable. After waiting a predetermined time period after transmitting the first pulse, a first amplitude of a reflected signal is detected on a second communications channel of the cable. Proper operation of the cable is verified based on the first amplitude. The predetermined time period corresponds with an estimated roundtrip propagation delay of the first pulse when the first pulse is reflected back to the cable testing system after traveling a first predetermined distance along the cable.

In other features, the first and second communications channels are the same communications channel. Alternatively, the first and second communications channels are different communications channels. A second pulse that is equal to the first pulse is transmitted on the first communications channel. After waiting the predetermined time period after transmitting the second pulse, a second amplitude of a reflected signal is detected on the second communications channel. An averaged amplitude is generated by averaging the first and second amplitudes. Proper operation of the cable is verified based on the averaged amplitude. A configuration of media with which the cable testing system currently communicates is detected. The predetermined time period is incrementally increased during subsequent iterations of a cable test in order to verify proper operation of a predetermined segment of the cable.

In still other features of the invention, the predetermined time period is set equal to zero during a first iteration of a cable test. The predetermined time period is incrementally increased during subsequent iterations of the cable test to a maximum time period corresponding with a length of the cable in order to verify proper operation of the cable. An offset value associated with a level of constant noise on the second communications channel is determined before the transmitting step. The offset value is subtracted from the first amplitude before the verifying step. A previously stored offset value is utilized when a difference between a current offset value and the previously stored offset value is greater than a rejection threshold. The second pulse is retransmitted when a difference between the first and second amplitudes is greater than a rejection threshold. The second amplitude is subsequently redetected. A sample fail counter is incremented after retransmitting any pulse. A current cable test is declared as failed when a value of the sample fail counter is greater than a predetermined count.

In yet other features, a timer is reset after the transmitting step. A subsequent pulse is transmitted only after the timer expires. A maximum value of the timer is associated with a maximum roundtrip propagation delay along the cable. The first pulse is refrained from being transmitted when activity is detected on at least one of the first and second communications channels. A first wait state is entered and a first timer is reset when activity is detected on the at least one of the first and second communications channels. While the cable testing system is in the first wait state, a current cable test is declared as failed when the first timer expires. While the cable testing system is in the first wait state, a second wait state is entered and a second timer is reset when the activity on the at least one of the first and second communications channels subsides. While the cable testing system is in the second wait state, the first pulse is transmitted when the second timer expires.

In still other features of the invention, while the cable testing system is in the second wait state, the first wait state is returned to when the activity on the at least one of the first and second communications channels recurs. A maximum peak mode is operated in. A maximum amplitude of the reflected signal is detected. A time corresponding with a distance along the cable at which the maximum amplitude originates is detected. Alternatively, a first peak mode is operated in. An earliest occurring peak of the reflected signal after which the amplitude of the reflected signal subsequently decreases by a first predetermined amplitude is detected. A time corresponding with a distance along the cable at which the earliest occurring peak originates is detected. Alternatively, a last peak mode is operated in. A latest occurring peak of the reflected signal after which the amplitude of the reflected signal subsequently decreases by a first predetermined amplitude is detected. A time corresponding with a distance along the cable at which the latest occurring peak originates is detected.

In yet other features, an $N^{th}$ peak mode is operated in. An $N^{th}$ peak of the reflected signal after which the amplitude of the reflected signal subsequently decreases by a first predetermined amplitude is detected. A time corresponding with a distance along the cable at which the $N^{th}$ peak originates is detected. The cable testing system is implemented in a waveform reconstruction system. A plurality of amplitudes of the reflected signal and times at which respective ones of the plurality of amplitudes occur while incrementally increasing the first predetermined time period from zero to the maximum time period are received. A reconstructed reflection signal is generated based on the plurality of amplitudes and the times at which respective ones of the plurality of amplitudes occur. A second amplitude of a reflected signal is detected on the first communications channel and then a third amplitude of a reflected signal is subsequently detected on the second communications channel while pulses are transmitted on the first communications channel. A fourth amplitude of a reflected signal is detected on the first communications channel and then a fifth amplitude of a reflected signal is subsequently detected on the second communications channel while transmitting pulses on the second communications channel.

In still other features of the invention, the cable is compliant with at least one of IEEE 10BASE-T, 100BASE-TX, 1000BASE-T, and 10 GBASE-T standards. The cable includes first, second, third, and fourth communications channels that are different. For each of the communications channels on which pulses are transmitted during a cable test, amplitudes of reflected signals are successively detected on each of the communications channels. Amplitudes of reflected signals are simultaneously detected on the first and second communications channels during a cable test. The cable includes first, second, third, and fourth communications channels that are different. Amplitudes of reflected signals are simultaneously detected on the first, second, third, and fourth communications channels during a cable test. The predetermined time period is initially set equal to zero. A plurality of amplitudes of the reflected signal is subsequently continued to be detected at a predetermined sampling rate. The plurality of amplitudes is stored.

In yet other features, the cable testing system is implemented in a waveform reconstruction system. The plurality of amplitudes and times at which respective ones of the plurality of amplitudes occur are received. A reconstructed reflection signal is generated based on the plurality of amplitudes and the times at which respective ones of the plurality of amplitudes occur. The cable includes first, second, third, and fourth communications channels that are different. Amplitudes of reflected signals are simultaneously detected at a predetermined sampling rate on the first, second, third, and fourth communications channels. The cable testing system is implemented in a physical layer device. The physical layer device is implemented in a network interface.

A computer program executed by a processor for operating a cable testing system that tests cable according to the present invention includes transmitting a first pulse on a first communications channel of the cable. After waiting a predetermined time period after transmitting the first pulse, a first amplitude of a reflected signal is detected on a second communications channel of the cable. Proper operation of the cable is verified based on the first amplitude. The predetermined time period corresponds with an estimated roundtrip propagation delay of the first pulse when the first pulse is reflected back to the cable testing system after traveling a first predetermined distance along the cable.

In other features, the first and second communications channels are the same communications channel. Alternatively, the first and second communications channels are different communications channels. A second pulse that is equal to the first pulse is transmitted on the first communications channel. After waiting the predetermined time period after transmitting the second pulse, a second amplitude of a reflected signal is detected on the second communications channel. An averaged amplitude is generated by averaging the first and second amplitudes. Proper operation of the cable is verified based on the averaged amplitude. A configuration of media with which the cable testing system currently communicates is detected. The predetermined time period is incrementally increased during subsequent iterations of a cable test in order to verify proper operation of a predetermined segment of the cable.

In still other features of the invention, the predetermined time period is set equal to zero during a first iteration of a cable test. The predetermined time period is incrementally increased during subsequent iterations of the cable test to a maximum time period corresponding with a length of the cable in order to verify proper operation of the cable. An offset value associated with a level of constant noise on the second communications channel is determined before the transmitting step. The offset value is subtracted from the first amplitude before the verifying step. A previously stored offset value is utilized when a difference between a current offset value and the previously stored offset value is greater than a rejection threshold. The second pulse is retransmitted when a difference between the first and second amplitudes is greater than a rejection threshold. The second amplitude is subsequently redetected. A sample fail counter is incremented after retransmitting any pulse. A current cable test is declared as failed when a value of the sample fail counter is greater than a predetermined count.

In yet other features, a timer is reset after the transmitting step. A subsequent pulse is transmitted only after the timer expires. A maximum value of the timer is associated with a maximum roundtrip propagation delay along the cable. The first pulse is refrained from being transmitted when activity is detected on at least one of the first and second communications channels. A first wait state is entered and a first timer is reset when activity is detected on the at least one of the first and second communications channels. While the cable testing system is in the first wait state, a current cable test is declared as failed when the first timer expires. While the cable testing system is in the first wait state, a second wait state is entered and a second timer is reset when the activity on the at least one of the first and second communications channels subsides. While the cable testing system is in the second wait state, the first pulse is transmitted when the second timer expires.

In still other features of the invention, while the cable testing system is in the second wait state, the first wait state is returned to when the activity on the at least one of the first and second communications channels recurs. A maximum peak mode is operated in. A maximum amplitude of the reflected signal is detected. A time corresponding with a distance along the cable at which the maximum amplitude originates is detected. Alternatively, a first peak mode is operated in. An earliest occurring peak of the reflected signal after which the amplitude of the reflected signal subsequently decreases by a first predetermined amplitude is detected. A time corresponding with a distance along the cable at which the earliest occurring peak originates is detected. Alternatively, a last peak mode is operated in. A latest occurring peak of the reflected signal after which the amplitude of the reflected signal subsequently decreases by a first predetermined amplitude is detected. A time corresponding with a distance along the cable at which the latest occurring peak originates is detected.

In yet other features, an $N^{th}$ peak mode is operated in. An $N^{th}$ peak of the reflected signal after which the amplitude of the reflected signal subsequently decreases by a first predetermined amplitude is detected. A time corresponding with a distance along the cable at which the $N^{th}$ peak originates is detected. The cable testing system is implemented in a waveform reconstruction system. A plurality of amplitudes of the reflected signal and times at which respective ones of the plurality of amplitudes occur while incrementally increasing the first predetermined time period from zero to the maximum time period are received. A reconstructed reflection signal is generated based on the plurality of amplitudes and the times at which respective ones of the plurality of amplitudes occur. A second amplitude of a reflected signal is detected on the first communications channel and then a third amplitude of a reflected signal is subsequently detected on the second communications channel while pulses are transmitted on the first communications channel. A fourth amplitude of a reflected signal is detected on the first communications channel and then a fifth amplitude of a reflected signal is subsequently detected on the second communications channel while transmitting pulses on the second communications channel.

In still other features of the invention, the cable is compliant with at least one of IEEE 10BASE-T, 100BASE-TX, 1000BASE-T, and 10 GBASE-T standards. The cable includes first, second, third, and fourth communications channels that are different. For each of the communications channels on which pulses are transmitted during a cable test, amplitudes of reflected signals are successively detected on each of the communications channels. Amplitudes of reflected signals are simultaneously detected on the first and second communications channels during a cable test. The cable includes first, second, third, and fourth communications channels that are different. Amplitudes of reflected signals are simultaneously detected on the first, second, third, and fourth communications channels during a cable test. The predetermined time period is initially set equal to zero. A plurality of amplitudes of the reflected signal is subsequently continued to be detected at a predetermined sampling rate. The plurality of amplitudes is stored.

In yet other features, the cable testing system is implemented in a waveform reconstruction system. The plurality of amplitudes and times at which respective ones of the plurality of amplitudes occur are received. A reconstructed reflection signal is generated based on the plurality of amplitudes and the times at which respective ones of the plurality of amplitudes occur. The cable includes first, second, third, and fourth communications channels that are different. Amplitudes of reflected signals are simultaneously detected at a predetermined sampling rate on the first, second, third, and fourth communications channels. The cable testing system is implemented in a physical layer device. The physical layer device is implemented in a network interface.

In still other features, the systems and methods described above are implemented by a computer program executed by one or more processors. The computer program can reside on a computer readable medium such as but not limited to memory, non-volatile data storage and/or other suitable tangible storage mediums.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
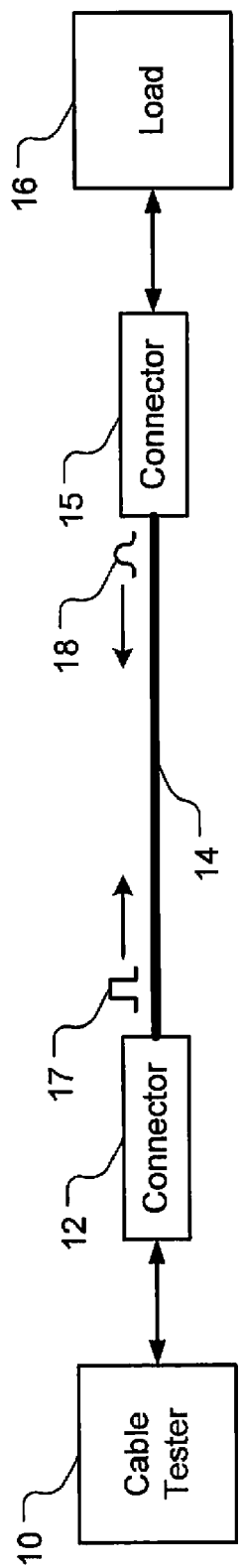
FIG. 1 is a functional block diagram of a cable tester according to the prior art.

The following description of the preferred embodiment(s) is merely exemplary in nature and is in no way intended to limit the invention, its application, or uses. For purposes of clarity, the same reference numbers will be used in the drawings to identify similar elements. As used herein, the term module, circuit and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present invention.

Figure 2:
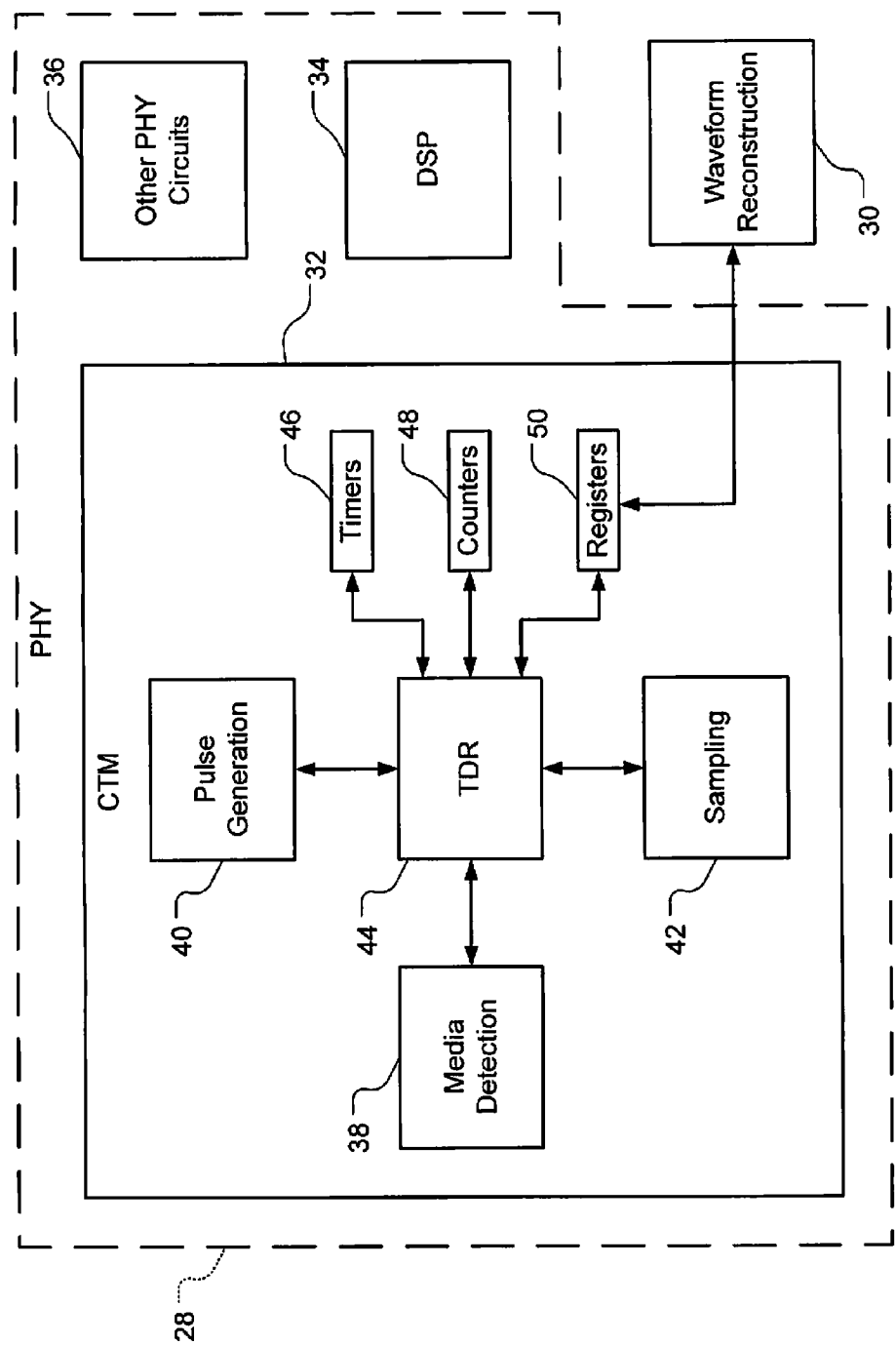
FIG. 2 is a functional block diagram of a physical layer device that includes a cable testing module according to the present invention and a waveform reconstruction module that is external to the physical layer device.

Referring now to FIG. 2, a network interface includes a physical layer device 28 and a waveform reconstruction module 30. The physical layer device 28 includes a cable testing module (CTM) 32, a digital signal processor (DSP) 34, and other conventional physical layer device circuits 36. The CTM 32 includes a media detection module 38 that detects a current configuration of media with which the physical layer device 28 communicates. For example, the physical layer device 28 may communicate with media according to standards such as IEEE 10BASE-T, 100BASE-TX, 1000BASE-T, 10 GBASE-T, and/or other standards. The CTM 32 includes a pulse generation module 40 that selectively transmits test pulses on a cable in order to verify proper operation of the cable. For example, a cable according to IEEE 1000BASE-T standards includes four pairs of twisted pair wires (A, B, C, and D). The pulse generation module 40 is capable of transmitting the pulse on any of the four pairs of twisted pair wires.

The CTM 32 also includes a sampling module 42. The sampling module 42 detects amplitudes of signals on any of the four pairs of twisted wires at a given time. For example, the sampling module 42 detects amplitudes of reflection signals on pairs of the cable that occur as a result of the test pulses. A reflection signal may be generated when a test pulse encounters a fault in the cable and/or when the test pulse reaches the end of the cable. Therefore, after transmitting a test pulse, the sampling module 42 may monitor the amplitude of reflection signals on a specific pair in order to detect a fault in the pair. As can be appreciated by those skilled in the art, the sampling module 42 is likewise capable of verifying proper operation of a pair.

In order to determine the location of a specific fault on a pair, the sampling module 42 detects the amplitude of reflection signals a predetermined time period after the pulse generation module 40 generates the test pulse. The predetermined time period corresponds with an estimated roundtrip propagation delay of a test pulse when the test pulse is reflected back from a fault after traveling a predetermined distance along the cable. For example, in order to determine whether a fault occurs near an end of the cable that is away from the physical layer device 28, the sampling module 42 waits a longer amount of time before detecting the amplitude of reflection signals than if the CTM were determining whether a fault occurs on the cable closer to the physical layer device 28.

The CTM 32 also includes a time domain reflection (TDR) module 44 that communicates with the pulse generation module 40, the media detection module 38, and the sampling module 42 and that coordinates testing of the cable. For example, a user may configure the TDR module 44 to execute a state machine that tests the cable in a specified manner. The TDR module 44 additionally communicates with a timer module 46 that includes required timers, a counter module 48 that includes required counters, and a register module 50 that includes required registers. The state machine that is executed by the TDR module 44 utilizes the timers 46 and counters 48 for process control and writes results to the registers 50. Processes that are executed external to the physical layer device 28 including the waveform reconstruction module 30 are capable of accessing results of the cable testing procedure through the register module 50.

The CTM 32 according to the present invention is capable of determining a distance along a cable at which a maximum reflection amplitude originates. The CTM 32 is also capable of indicating a distance along the cable at which a first peak having a minimum reflection amplitude originates. By using the waveform reconstruction module 30, a user is capable of reconstructing an entire reflected waveform. The sampling module 42 is capable of detecting amplitudes of reflected signals on the same pair on which the pulse generation module 40 transmits a test pulse. For example, this allows the CTM 32 to detect undesirable echo effects. Alternatively or additionally, the sampling module 42 is capable of detecting amplitudes of reflected signals on pairs of the cable other than the pair on which the pulse generation module 40 transmits the test pulse when the cable includes multiple communications channels. For example, this allows the CTM 32 to detect undesirable near-end cross-talk (NEXT) effects. Additionally, the CTM 32 generates samples of an amplitude at a particular time multiple times so that effects from noise are minimized.

Figure 3:
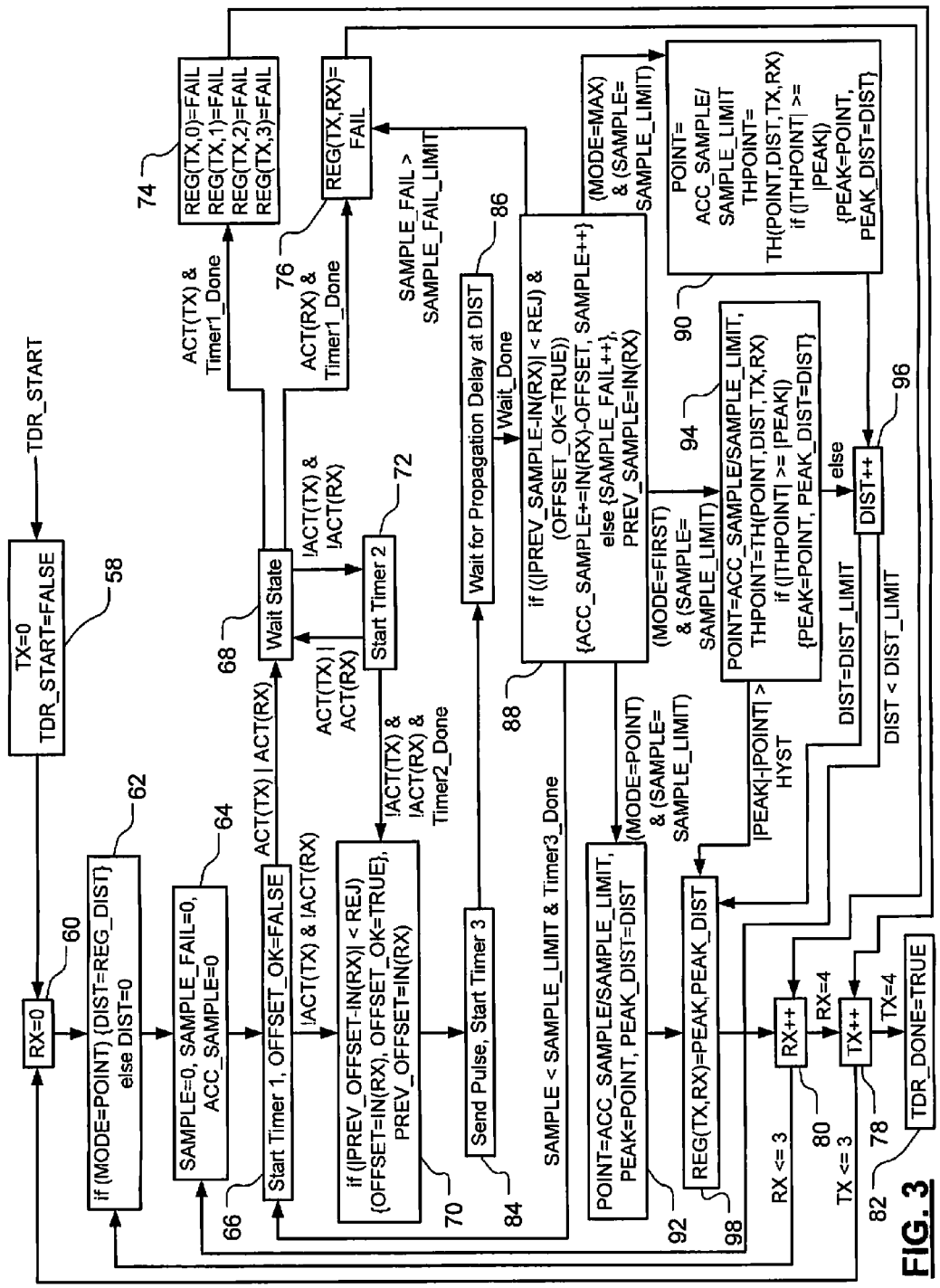
FIG. 3 is a state diagram for the cable testing module of FIG. 2.

Referring now to FIG. 3, state operation of the CTM 32 is illustrated. The CTM 32 begins in a start state 58 when a testing flag TDR_START is set. In the start state 58, the variable TX is set equal to zero and the TDR_START flag is set to FALSE. The variable TX refers to the current transmit channel, and the variable RX refers to the current receive channel. For example, media that is compliant with IEEE 1000BASE-T standards includes four channels (identified at 0, 1, 2, and 3) on which the CTM 32 may transmit or receive. Therefore, in the case of gigabit Ethernet media, TX and RX each have a value between 0 and 3.

The CTM 32 proceeds to an initialization state 60 where the RX variable is cleared to zero. In an exemplary embodiment, the CTM 32 monitors conditions on all channel combinations in the cable. For example, the CTM 32 may transmit a pulse on channel 0 while detecting a reflection amplitude on channel 3. When a cable includes four communications channels, there are 4×4=16 channel combinations available for testing.

In a distance initialization state 62, the distance, determined by variable DIST, is set to a programmed distance REG_DIST when the CTM 32 is in a Point Mode. Otherwise, the distance is set equal to zero in the distance initialization state 62. The distance DIST refers to the distance along the cable corresponding to the time at which the sampling module 42 detects the reflection amplitude. For example, in order to detect the maximum reflection amplitude along the length of the cable, the distance value is incremented and the sampling module 42 detects reflection amplitudes until the process is completed along the entire length of the cable.

In a sample initialization state 64, the current sample number SAMPLE is set equal to zero, the number of failed samples for a specific point SAMPLE_FAIL is set equal to zero, and the current accumulated sample value ACC_SAMPLE is set equal to zero. In an activity detection state 66, a first timer (identified as Timer 1) is reset, and an offset condition flag OFFSET_OK is set to FALSE, as will be described in further detail below. For example, Timer 1 may be set to 100 ms or another value. During the activity detection state 66, the sampling module 42 determines whether there is activity on the current transmit channel and/or the current receive channel. If there is activity on either the current transmit channel or the current receive channel, the CTM 32 enters a first wait state 68. Otherwise, the CTM 32 enters an offset detection state 70.

The CTM 32 enters the first wait state 68 when activity is detected on a channel required for testing. As long as Timer 1 is not expired, the sampling module 42 waits for the current transmit and receive channel to become free of activity. When this occurs, the CTM 32 enters a second wait state 72. During the second wait state 72, a second timer (identified as Timer 2) is reset. For example, Timer 2 may be set to 3 μs or another value. As long as activity is not detected on the current transmit and receive channels, the CTM 32 waits in the second wait state 72 to ensure that the activity on the current transmit and/or receive channel does not recur for a minimum period of time.

If activity was not detected on the current transmit and receive channels for the duration of the second timer, the CTM 32 enters the offset detection state 70. Otherwise, if activity is detected on the current transmit and/or receive channel while the second timer is running, the CTM 32 returns to the first wait state 68. However, the first timer is not reset when the CTM 32 returns to the first wait state 68. Therefore, if the CTM 32 fails to enter the offset detection state 70 before the first timer expires, the CTM 32 enters one of first or second failure states 74 or 76, respectively.

The CTM 32 enters the first failure state 74 when the first timer expires and activity is detected on the current transmit channel. During the first failure state 74, registers corresponding with transmit/receive channel combinations including the current transmit channel are set equal to a predefined failure identifier. The CTM 32 enters the second failure state 76 when the first timer expires and activity is detected on the current receive channel. During the second failure state 76, a register corresponding with the current transmit/receive combination is set equal to the failure identifier. The CTM 32 proceeds from the first failure state 74 to a transmit channel increment state 78, and from the second failure state 76 to a receive channel increment state 80.

During the receive channel increment state 80, the CTM 32 increments the value of the current receive channel. If the current receive channel is set equal to 4, the CTM 32 enters the transmit channel increment state 78. Otherwise, the CTM 32 returns to the distance initialization state 62. During the transmit channel increment state 78, the CTM 32 increments the value of the current transmit channel. If the current transmit channel is set equal to 4, the CTM 32 enters the test complete state 82. Otherwise, the CTM 32 returns to the initialization state 60. During the test complete state 82, the flag TDR_DONE is set to TRUE, which indicates the end of the current test.

During the offset detection state 70, the current offset value OFFSET is set equal to the detected value on the current receive channel and OFFSET_OK is set to TRUE when the difference between the previous offset PREV_OFFSET and the detected value on the current receive channel is less than a rejection threshold REJ. Otherwise, the value of OFFSET remains the same. Additionally, PREV_OFFSET is set equal to the detected value on the current receive channel. In other words, the CTM 32 ensures that the level of detected base noise does not significantly fluctuate between samples. The CTM 32 computes the offset so that any systematic offset is identified and later subtracted from reflection amplitude values in order to prevent unnecessary influence from noise.

Since many samples are taken for each point, the pulse generation module 40 could conceivably generate several thousand pulses during a single test. If the physical layer device 28 is connected to a link partner, the physical layer device 28 may break the link. However, the link partner may continue to transmit link pulses. In one approach, the worst case link pulse time may be estimated, and the system can wait for a predetermined time period after a link pulse is received. This is similar to using autonegotiation times as a reference for TDR cable testing. However, if the current system sends out several thousand link pulses during a single test, it would take a very long time to complete the test if link pulse times are considered. Therefore, the CTM 32 of the present invention does not rely on autonegotiation processes as a reference. For example, if a link pulse is detected, it will be identified as noise and the system will attempt the sample again. Therefore, the rejection threshold REJ is used as a reference in order to compare points to a bounded range of acceptable values under given cable conditions.

During a pulse transfer state 84, the pulse generation module 40 transmits a pulse on channel TX and the CTM 32 starts a third timer (identified as Timer 3). During a propagation delay state 86, the CTM 32 waits to proceed until a propagation delay associated with the current value of DIST expires. For example, the propagation delay may be associated with the current distance along the cable. In an exemplary embodiment, the propagation delay is between 0 and 254 clock cycles to correlate with the maximum length of the cable.

During a sample accumulation state 88, the CTM 32 determines whether the difference between a current sample (identified by IN(RX)) and a previous sample (identified by PREV_SAMPLE) is less than the rejection threshold REJ. The CTM 32 also determines whether OFFSET_OK is set to TRUE. If both conditions are true, ACC_SAMPLE is increased by the difference between the detected value on the current receive channel and the current offset and the sample number SAMPLE is incremented. Otherwise, the sample is considered a failure and SAMPLE_FAIL is incremented. In either case, PREV_SAMPLE is set equal to the current value detected on the receive channel.

Because noise or data from a link partner may appear on a receive channel during testing, the CTM 32 only accumulates a given sample if the difference between the current and previous samples is less than the rejection threshold REJ and also OFFSET_OK is set to TRUE, which means that the difference between the current and previous offset is less than REJ. If either condition is not met, the SAMPLE_FAIL counter is incremented and the system attempts to capture the sample again. If the failed sample counter SAMPLE_FAIL is greater than a predetermined failed sample limit SAMPLE_FAIL_LIMIT, the current transmit/receive combination is deemed a failure and the CTM 32 proceeds to the second failure state 76.

The CTM 32 acquires multiple samples of each point and determines an average. This minimizes possible influences on the measurements due to noise and also ensures a more accurate reading. For example, the CTM 32 may sample each point 128 times before averaging the samples. As long as the current number of samples is less than the sample limit and the third timer is expired, the CTM 32 returns to the activity detection state 66. In an exemplary embodiment, the number of samples per point is a power of 2 so that the accumulated sample value is easier to divide.

After the pulse generation module 40 transmits a pulse on the current transmit channel, the CTM 32 waits for a maximum round-trip propagation time before transmitting another pulse on the same transmit channel. This prevents the reflection of a first pulse from interfering with the measurement of a second pulse. For example, the sampling module 42 may only wait a short period before detecting a reflection amplitude when the current distance along the cable is very small. In an exemplary embodiment, the third timer is set to 3 µs to correspond with a maximum roundtrip time of 2 µs, although other values may be used.

When the current number of samples reaches the sample limit, the CTM 32 proceeds based on the currently selected mode. For example, if the currently selected mode is Max, which refers to detecting the amplitude and distance along the cable where the reflection amplitude is at a maximum, the CTM 32 proceeds to a maximum peak state 90. If the currently selected mode is Point, which refers to detecting only the reflection amplitude at a specified distance along the cable, the CTM 32 proceeds to a point detection state 92. Otherwise, if the currently selected mode is First, which refers to detecting the amplitude and distance along the cable where a reflection amplitude exists above a certain threshold and decreases by a specified amount, the CTM 32 proceeds to a first peak state 94.

During the maximum peak state 90, the sampling module 42 computes the averaged point value by dividing the accumulated sample by the total number of samples taken. Sometimes even a cable that complies with specifications will exhibit small reflections. It is typically beneficial to ignore these reflections. Therefore, the sampling module 42 utilizes a function TH that ensures the averaged point is within an expected range determined by the current distance along the cable and whether the current transmit/receive pair is a same communications channel pair or a cross communications channel pair. If the averaged point is within the expected range, THPOINT is set equal to the value of the averaged point. Otherwise, THPOINT is set equal to zero and the averaged point is not considered as a possible maximum point along the reflection amplitude waveform.

If THPOINT is greater than the current maximum point PEAK, then PEAK is set equal to the value of the averaged point and the current distance at which the peak occurs PEAK_DIST is set equal to the current distance DIST. Theoretically, a different threshold can be set for each distance increment along the length of the cable. However, this may be unnecessarily complex. In an exemplary embodiment, five threshold settings exist for a same communications channel pair with breakpoints at 10 m, 50 m, 110 m, and 140 m. Additionally, two threshold settings may exist for cross communications channel pairs with a breakpoint at 30 m. The actual values of the thresholds are preferably calibrated based on an amount of impedance mismatch allowed before reporting a reflection.

The CTM 32 proceeds from the maximum peak state 90 to a distance increment state 96. During the distance increment state 96, the current distance value is incremented. Since the Max mode determines the maximum peak along the entire length of the cable, the current distance along the cable is incremented until the entire cable is checked. If the current distance DIST is less than the distance limit DIST_LIMIT, the CTM 32 returns to the sample initialization state 64. Otherwise, if the current distance is equal to the distance limit, the CTM 32 proceeds to a point storage state 98. During the point storage state 98, a register associated with the current transmit/receive combination is written with the current value of PEAK and the current value of PEAK_DIST. The CTM 32 proceeds from the point storage state 98 to the receive channel increment state 80.

During the point detection state 92, the sampling module 42 computes the averaged point by dividing the accumulated sample by the total number of samples taken. The value for PEAK is set equal to the current point, and the value for PEAK_DIST is set equal to the current distance. The TH function is not utilized during the point detection state 92 because the mode Point seeks to determine the reflection amplitude at a desired distance along the cable no matter what conditions are present or what previous measurements have been made. The CTM 32 proceeds from the point detection state 92 to the point storage state 98.

Figure 4:
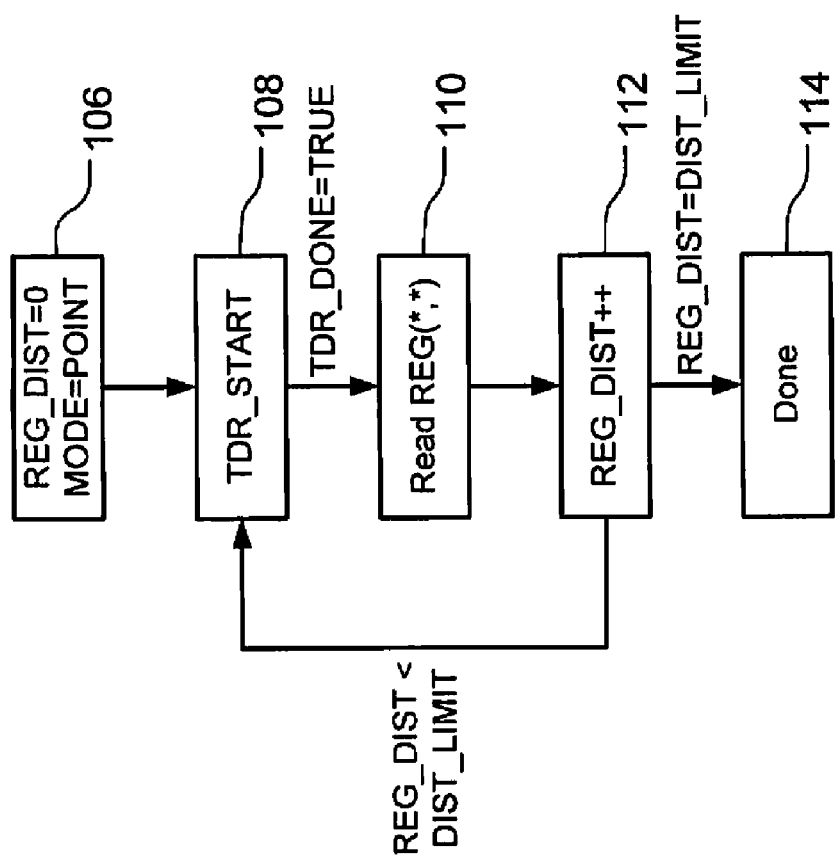
FIG. 4 is a state diagram for the waveform reconstruction module of FIG. 2.

Referring now to FIG. 4, state operation of the waveform reconstruction module 30 in order to reconstruct an entire reflection amplitude waveform along the entire cable is illustrated. The waveform reconstruction module 30 begins in an initialization state 106. During the initialization state 106, the desired distance REG_DIST is set equal to zero and the current mode is set equal to Point. During a sampling activation state 108, the flag TDR_START is set to TRUE in order to activate the state machine shown in FIG. 3. The state machine shown in FIG. 3 is complete when the flag TDR_DONE is set equal to TRUE. At that point, the waveform reconstruction module 30 proceeds to a read register state 110. During the read register state 110, the waveform reconstruction module 30 reads the registers 50 associated with all the transmit/receive combinations by executing the command "Read_REG(*,*)". For example, in a gigabit Ethernet system, the waveform reconstruction module 30 reads 16 registers during the read register state 110.

During a distance increment state 112, the waveform reconstruction module 30 increments the desired distance REG_DIST. If the desired distance is less than a distance limit DIST_LIMIT, the waveform reconstruction module 30 returns to the sample activation state 108. Otherwise, when the desired distance is equal to the distance limit, the waveform reconstruction module 30 proceeds to a finished state 114, which identifies the end of the data collection for the reconstructed reflection amplitude waveform. The waveform reconstruction process according to the present invention eliminates the need to store a dedicated RAM chip on the physical layer device 28 for TDR cable testing. Additional RAM increases the surface area and cost of the physical layer device 28. Also, all desired processing related to TDR cable testing data can be done off of the physical layer device 28.

Referring again to FIG. 3, during the first peak state 94, the sampling module 42 computes the averaged point value POINT by dividing the accumulated sample ACC_SAMPLE by the total number of samples taken SAMPLE. The sampling module 42 then utilizes the TH function to ensure that the average point is within the allowable range. If the averaged point is within the expected range, THPOINT is set equal to the value of the averaged point. Otherwise, THPOINT is set equal to zero and the averaged point is not considered as a possible peak along the reflection amplitude waveform.

If THPOINT is greater than the current maximum point PEAK, then PEAK is set equal to the value of the averaged point and the current distance at which the peak occurs PEAK_DIST is set equal to the current distance DIST. Therefore, the maximum peak state 90 and the first peak state 94 operate in a substantially similar manner. However, the CTM 32 only proceeds from the first peak state 94 to the distance increment state 96 when another condition is not met.

In order to determine that a current maximum value is a true peak, the reflection amplitude waveform is required to decrease by a predetermined amount after the peak is identified. Otherwise, if the waveform continues to increase after the current maximum value, the amplitude of the current peak has not actually been reached and some other condition such as noise likely caused a temporary decrease in the waveform. Therefore, the CTM 32 continues to determine the difference between a current POINT value and the currently identified peak value PEAK. As soon as the difference between the current point and the current peak is greater than a predetermined value (identified as hysteresis value HYST), the CTM 32 proceeds from the first peak state 94 to the point storage state 98.

Figure 5:
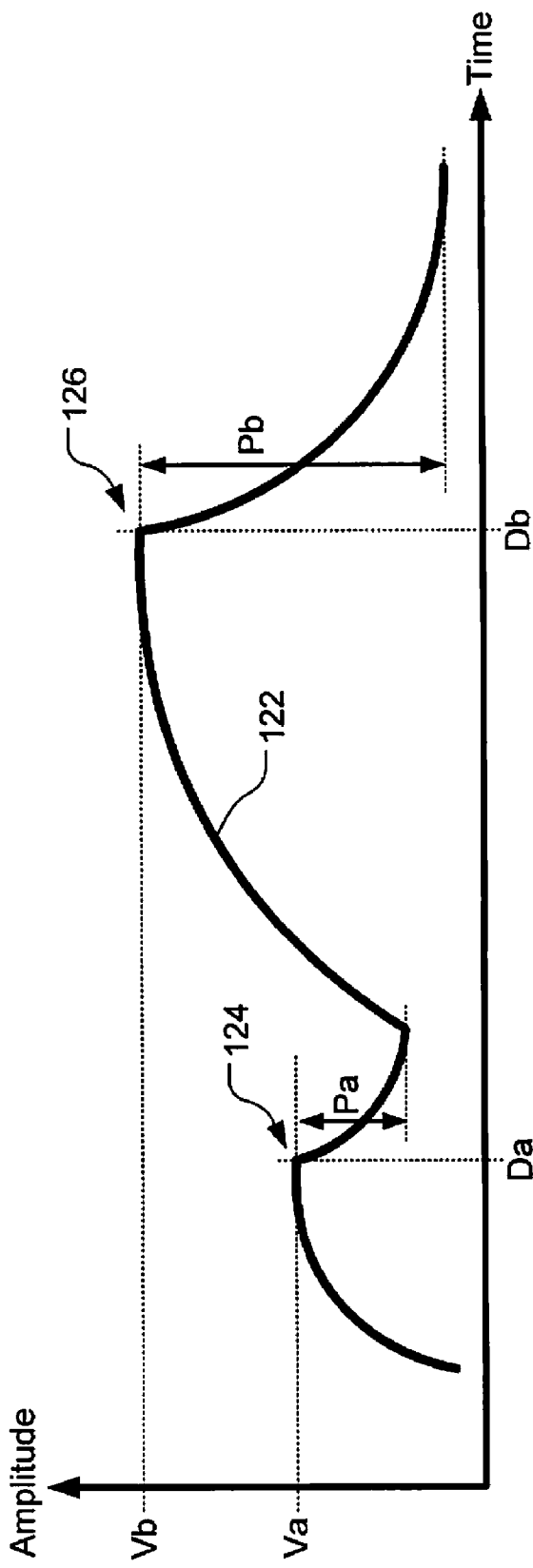
FIG. 5 is a graph illustrating a reflection amplitude waveform as a function of time including peaks in the waveform having associated hysteresis values.

Referring now to FIG. 5, a reflection amplitude waveform 122 illustrates the function of the first peak state 94. A first peak 124 of height Va is identified at distance Da. From there, the waveform decreases by Pa before beginning to rise again. If the hysteresis value HYST is less than or equal to Pa, then the peak 124 at Da will be identified as the first qualifying peak 124 in the reflection amplitude waveform 122. Otherwise, the system will eventually identify a peak 126 of height Vb and distance Db. After point Db, the waveform 122 decreases by Pb. If the hysteresis value is greater than or equal to Pa but less than or equal to Pb, then the peak 126 at Db will be identified as the first qualifying peak 126 in the reflection amplitude waveform 122.

The CTM 32 is capable of detecting individual peaks of reflection amplitude waveforms other than earliest occurring peaks. For example, the CTM 32 may keep track of the number of times that the hysteresis value is satisfied for a given reflection amplitude waveform. Additionally, the PEAK and PEAK_DIST values may be cleared each time a peak other than a desired qualifying peak is detected. This ensures that a null value is reported when a reflection amplitude waveform does not include enough peaks to satisfy the desired peak number.

Alternatively, the PEAK and PEAK_DIST values may be cleared only when a new qualifying peak is detected so that a latest occurring peak may be identified no matter where the latest occurring peak is located in the reflection amplitude waveform. In an exemplary embodiment, the state operation illustrated in FIG. 3 is modified in order to facilitate detection of a desired qualifying peak in a reflection amplitude waveform. For example, an additional state may be located between the first peak state 94 and the point storage state 98.

Figure 6:
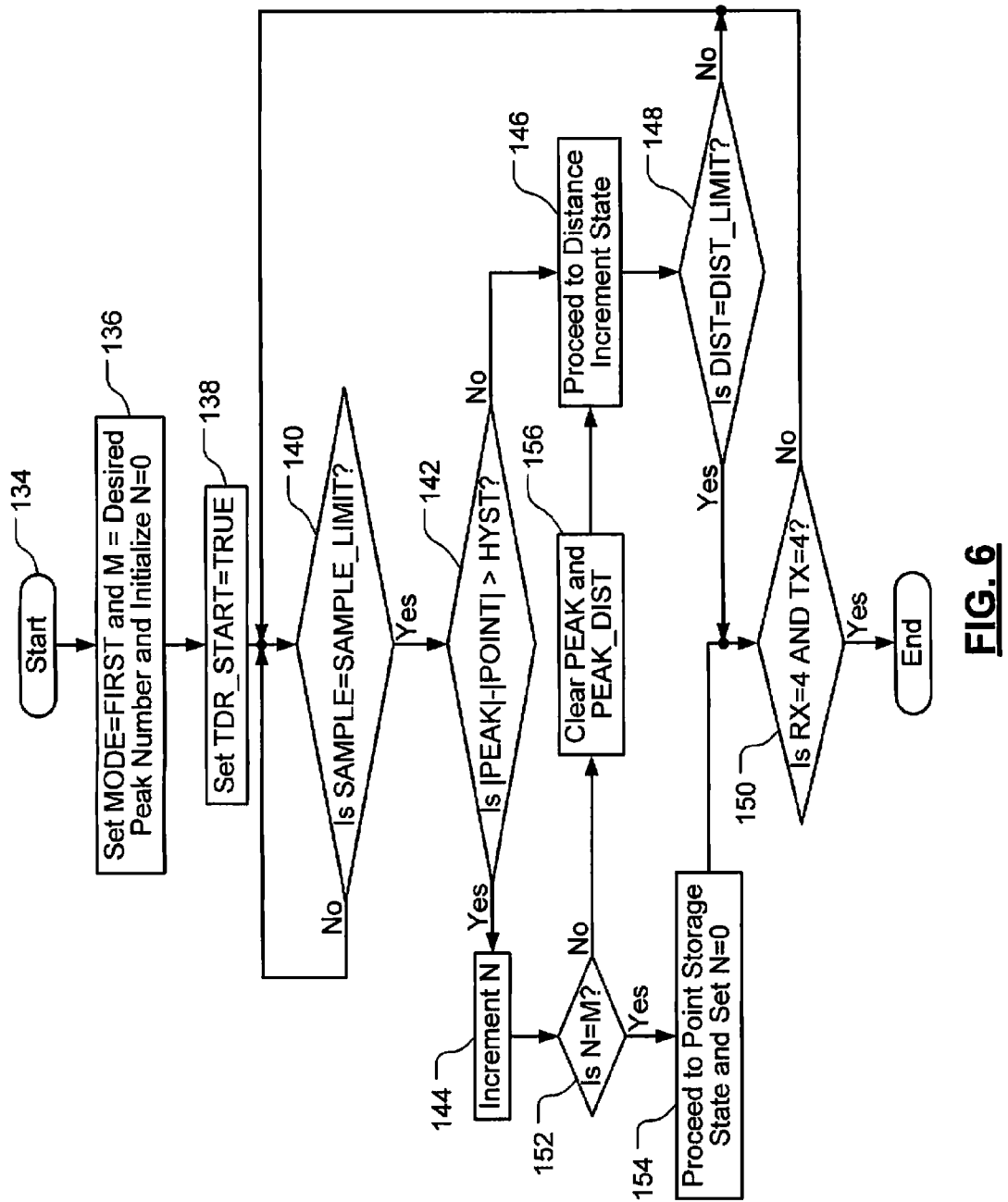
FIG. 6 is a flowchart illustrating steps performed by the cable testing module of FIG. 2 to detect a peak in a reflected signal having a minimum amplitude and located in desired chronological position.

Referring now to FIG. 6, an individual peak detection algorithm begins in step 134. In step 136, the CTM 32 sets MODE equal to First and sets a variable M equal to a desired peak number to detect in chronological order. The CTM 32 also initializes a variable N by setting it equal to zero in step 136. In step 138, the cable testing system sets TDR_START equal to TRUE, which initiates the state operation illustrated in FIG. 3. In step 140, control determines whether SAMPLE is equal to SAMPLE_LIMIT, which indicates that a new point has been detected. If false, control loops to step 140. If true, control proceeds to step 142, where control determines whether the difference between the absolute value of PEAK and the absolute value of POINT is greater than HYST, which indicates that a new qualifying peak has been detected. If true, control proceeds to step 144. If false, control proceeds to step 146, where the state operation proceeds to the distance increment state 96.

In step 148, control determines whether DIST is equal to DIST_LIMIT. If false, control returns to step 140. If true, control proceeds to step 150. In step 144, the CTM 32 increments N. In step 152, control determines whether N is equal to M, which indicates that the current qualifying peak is the desired peak. If true, control proceeds to step 154. If false, control proceeds to step 156 where the CTM 32 clears PEAK and PEAK_DIST and control proceeds to step 146. In step 154, the state operation proceeds to the point storage state 98, and the CTM 32 sets N equal to zero. In step 150, control determines whether both RX is equal to four and TX is equal to 4. If false, control returns to step 140. If true, control ends.

Figure 7:
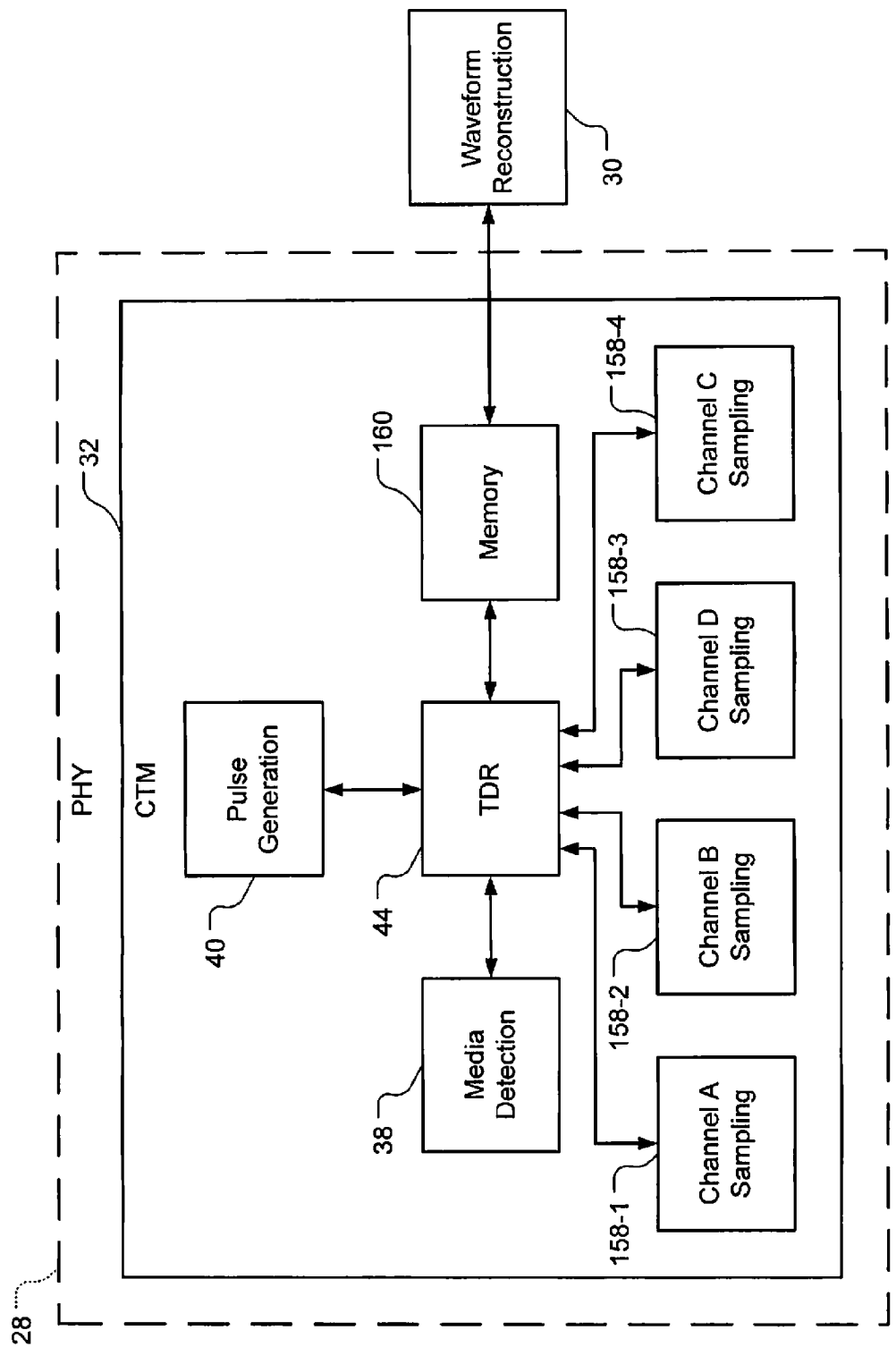
FIG. 7 is a functional block diagram of a cable testing module that includes memory and separate sampling modules for each channel of a cable.

Referring now to FIG. 7, the CTM 32 may include multiple sampling modules 158 so that multiple communications channels of the cable may be simultaneously sampled during a cable test. For example, if a cable includes four communications channels, the CTM 32 may include first, second, third, and fourth sampling modules 158-1 to 158-4, respectively, which sample respective ones of the communications channels. This reduces the amount of time required to test all of the possible transmit/receive pair combinations for a cable.

Additionally, if state operation analogous to that illustrated in FIG. 3 is utilized, only three additional registers 50 are required in order to store values detected by each of the sampling modules 158 at the same time. Those skilled in the art can appreciate that the CTM 32 may also include two, three, or another number of sampling modules 158. In any case, it is possible to decrease the amount of time required for cable testing by increasing the amount of cable testing hardware in the physical layer device 28.

Alternatively or additionally, the CTM 32 may also include a memory module 160. The memory module 160 allows sampling modules 158 to detect multiple amplitudes for every pulse that is transmitted by the pulse generation module 40. For example, after the pulse generation module 40 transmits a pulse, one or more sampling modules 158 may continuously sample a communications channel at a predetermined sampling frequency. As the sampling modules 158 generate the amplitudes, the TDR module 44 stores the amplitudes and times at which respective ones of the amplitudes occur in the memory module 160. Therefore, the CTM 32 is capable of obtaining the data required to reconstruct a reflection amplitude waveform for a particular transmit/receive channel combination after transmitting only a single pulse.

The CTM 32 may further reduce the duration of a cable test by including both the memory module 160 and the first, second, third, and fourth sampling modules 158. For example, the CTM 32 is capable of simultaneously obtaining the data required to reconstruct reflection amplitude waveforms for four transmit/receive channel combinations. In this case, the CTM 32 is capable of testing all transmit/receive channel combinations by transmitting only four pulses.

Additionally, the waveform reconstruction module 30 is capable of reading the data that is stored in the memory module 160 at any time during a cable test. For example, the waveform reconstruction module 30 may compare two consecutive reconstructed reflection amplitude waveforms for a single transmit/receive channel combination. In this case, the waveform reconstruction module 30 may request that the CTM 32 repeats any or all of a cable test when discrepancies exist between the reflection amplitude waveforms. The waveform reconstruction module 30 allows for all intensive processing related to cable testing to be done by software and/or all intensive data storage to be located external to the physical layer device 28. This reduces the cost and size of the physical layer device 28.

Figure 8:
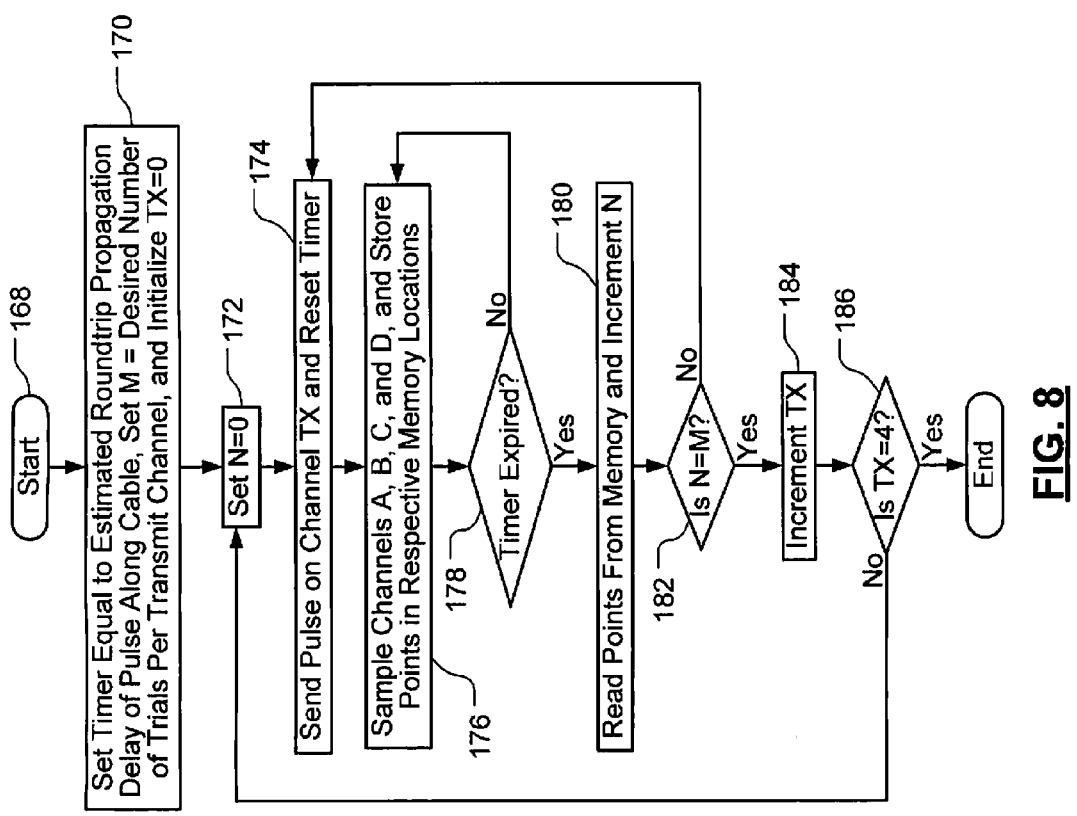
FIG. 8 is a flowchart illustrating steps performed by the cable testing module of FIG. 7 to test each transmit/receive channel combination of a cable.

Referring now to FIG. 8, a cable test algorithm begins in step 168. In step 170, the CTM 32 sets a timer 46 equal to an estimated roundtrip propagation delay of a pulse along the cable. Additionally, the CTM 32 sets a variable M equal to a desired number of pulses to be transmitted on each transmit channel and initializes TX as equal to zero in step 170. In step 172, the CTM 32 sets a variable N equal to zero. In step 174, the pulse generation module 40 transmits a pulse on channel TX and resets the timer 46. In step 176, the sampling modules 158 sample all of the communications channels and the TDR module 44 stores the amplitudes and times at which respective ones of the amplitudes occur in the memory module 160.

In step 178, control determines whether the timer 46 has expired. If false, control returns to step 176. In other words, the sampling modules 158 continue to sample the communications channels as long as the timer 46 is not expired. If true, control proceeds to step 180, where the waveform reconstruction module 30 reads the values stored in the memory module 160, and the CTM 32 increments N. In step 182, control determines whether N is equal to M. If false, control returns to step 174. If true, control proceeds to step 184, where the CTM 32 increments TX. In step 186, control determines whether TX is equal to four. If false, control returns to step 172. If true, control ends.

Figure 9A:
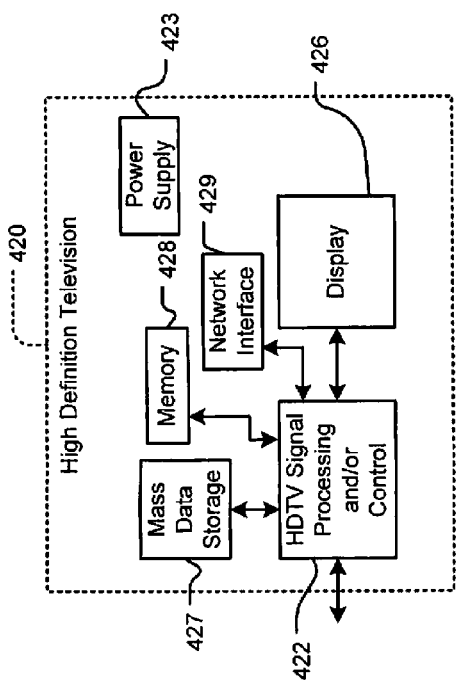
FIG. 9A is a functional block diagram of a high definition television.
Figure 9B:
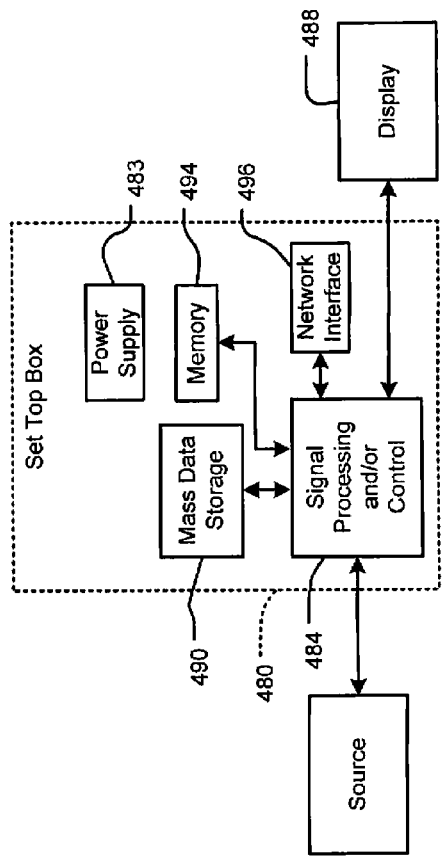
FIG. 9B is a functional block diagram of a set top box.
Figure 9C:
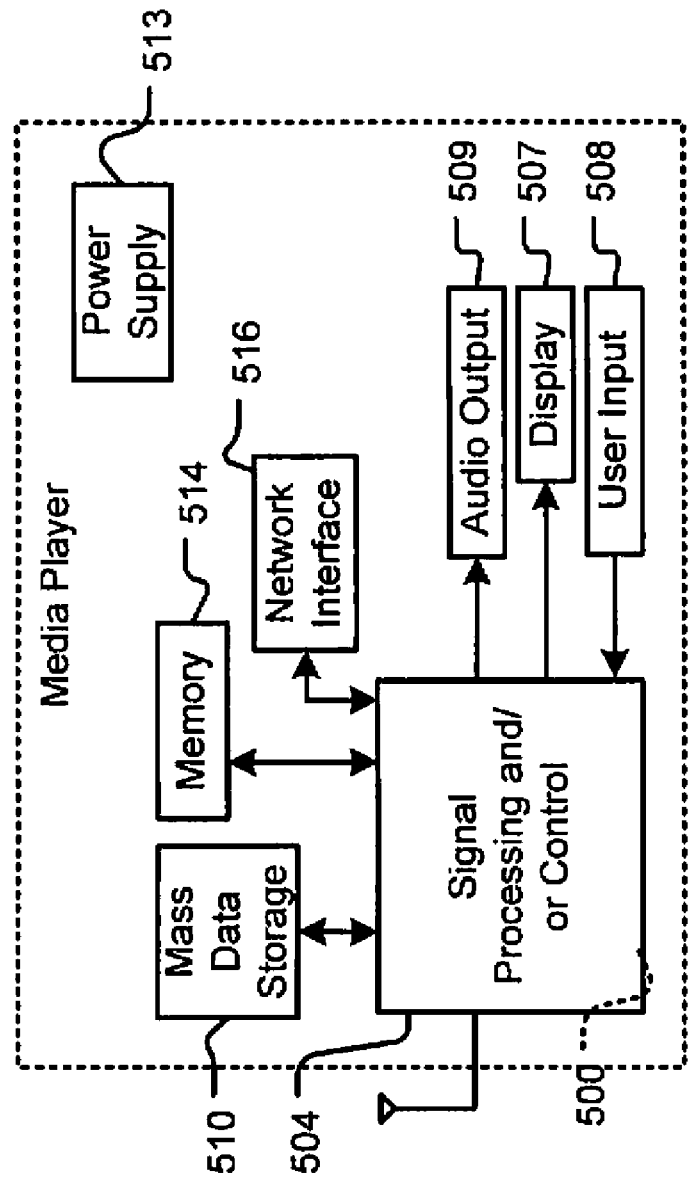
FIG. 9C is a functional block diagram of a media player.

Referring now to FIGS. 9A-9C, various exemplary implementations of the present invention are shown. Referring now to FIG. 9A, the present invention can be implemented in a high definition television (HDTV) 420. For example, the present invention may implement and/or be implemented in a network interface 429 of the HDTV 420. The HDTV 420 receives HDTV input signals in either a wired or wireless format and generates HDTV output signals for a display 426. In some implementations, signal processing circuit and/or control circuit 422 and/or other circuits (not shown) of the HDTV 420 may process data, perform coding and/or encryption, perform calculations, format data and/or perform any other type of HDTV processing that may be required. The HDTV 420 includes a power supply 423.

The HDTV 420 may communicate with mass data storage 427 that stores data in a nonvolatile manner such as optical and/or magnetic storage devices. For example, the mass data storage 427 may include a hard disk drive (HDD) and/or a mini HDD that includes one or more platters having a diameter that is smaller than approximately 1.8". The HDTV 420 may be connected to memory 428 such as RAM, ROM, low latency nonvolatile memory such as flash memory and/or other suitable electronic data storage. The HDTV 420 also may support connections with a local area network (LAN) via the network interface 429.

Referring now to FIG. 9B, the present invention can be implemented in a set top box 480. For example, the present invention may implement and/or be implemented in a network interface 496 of the set top box 480. The set top box 480 receives signals from a source such as a broadband source and outputs standard and/or high definition audio/video signals suitable for a display 488 such as a television and/or monitor and/or other video and/or audio output devices. The signal processing and/or control circuits 484 and/or other circuits (not shown) of the set top box 480 may process data, perform coding and/or encryption, perform calculations, format data and/or perform any other set top box function. The set top box 480 includes a power supply 423.

The set top box 480 may communicate with mass data storage 490 that stores data in a nonvolatile manner. The mass data storage 490 may include optical and/or magnetic storage devices, for example hard disk drives HDD and/or DVDs. At least one HDD may be a mini HDD that includes one or more platters having a diameter that is smaller than approximately 1.8". The set top box 480 may be connected to memory 494 such as RAM, ROM, low latency nonvolatile memory such as flash memory and/or other suitable electronic data storage. The set top box 480 also may support connections with a LAN via the network interface 496.

Referring now to FIG. 9C, the present invention can be implemented in a media player 500. For example, the present invention may implement and/or be implemented in a network interface 516 of the media player 500. In some implementations, the media player 500 includes a display 507 and/or a user input 508 such as a keypad, touchpad and the like. In some implementations, the media player 500 may employ a graphical user interface (GUI) that typically employs menus, drop down menus, icons and/or a point-and-click interface via the display 507 and/or user input 508. The media player 500 further includes an audio output 509 such as a speaker and/or audio output jack. The signal processing and/or control circuits 504 and/or other circuits (not shown) of the media player 500 may process data, perform coding and/or encryption, perform calculations, format data and/or perform any other media player function. The media player 500 includes a power supply 423.

The media player 500 may communicate with mass data storage 510 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may be a mini HDD that includes one or more platters having a diameter that is smaller than approximately 1.8". The media player 500 may be connected to memory 514 such as RAM, ROM, low latency nonvolatile memory such as flash memory and/or other suitable electronic data storage. The media player 500 also may support connections with a LAN via the network interface 516. Still other implementations in addition to those described above are contemplated.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A cable testing system comprising:
a pulse generation module that (i) transmits a first pulse on a first communication channel of a first wire of a first cable, wherein the first communication channel is provided via the first cable, and (ii) that does not transmit the first pulse on a second communication channel of a second wire a second cable, wherein the second communication channel is provided via the second cable;
a sampling module that detects a first amplitude of a first reflected signal on the second communication channel and generates a first amplitude signal, wherein the first reflected signal is a reflected version of the first pulse; and
a time domain reflection (TDR) module that verifies proper operation of at least one of the first cable or the second cable based on the first amplitude signal.

2. The cable testing system of claim 1, wherein:
the first communication channel is provided via a first twisted wire pair; and
the second communication channel is provided via a second twisted wire pair.

3. The cable testing system of claim 1, wherein the pulse generation module, the sampling module, and the TDR module are implemented on an integrated circuit.

4. The cable testing system of claim 1, wherein:
the sampling module detects the first amplitude subsequent to waiting a predetermined period after the pulse generation module transmitted the first pulse; and
the predetermined period corresponds to an estimated roundtrip propagation delay of the first pulse when the first pulse is reflected back to the cable testing system subsequent to traveling a first predetermined distance along at least one of the first cable or the second cable.

5. The cable testing system of claim 4, wherein:
the pulse generation module transmits a second pulse on the first communication channel, wherein an amplitude of the second pulse is equal to an amplitude of the first pulse;
the sampling module detects a second amplitude of a second reflected signal on the second communication channel subsequent to waiting the predetermined period after the pulse generation module transmits the second pulse, wherein the second reflected signal is a reflected version of the second pulse; and
the TDR module is configured to (i) determine an average amplitude by averaging the first amplitude and the second amplitude and (ii) verify proper operation of at least one of the first cable or the second cable based on the average amplitude.

6. The cable testing system of claim 5, wherein:
the pulse generation module retransmits the second pulse; and
the sampling module redetects the second amplitude when a difference between the first amplitude and the second amplitude is greater than a rejection threshold.

7. The cable testing system of claim 4, wherein the sampling module (i) incrementally increases the predetermined period during iterations of a cable test and (ii) subsequent to waiting the incrementally increased predetermined period, verifies proper operation of a predetermined segment of at least one of the first cable or the second cable during at least one of the iterations and based on the first amplitude signal.

8. The cable testing system of claim 7, wherein the sampling module (i) sets the predetermined period equal to a predetermined value during a first iteration of a cable test, (ii) incrementally increases the predetermined period during subsequent iterations of the cable test to a maximum period corresponding to a length of at least one of the fast cable or the second cable, and (iii) verifies proper operation of at least one of the first cable or the second cable during at least one of the subsequent iterations and based on the first amplitude signal.

9. A waveform reconstruction system comprising:
the cable testing system of claim 8; and
a waveform reconstruction module that receives a plurality of amplitudes of the first reflected signal at times of respective ones of the plurality of amplitudes while the sampling module incrementally increases the predetermined period from the predetermined value to the maximum period,
wherein the waveform reconstruction module generates a reconstructed reflection signal based on the plurality of amplitudes and the times of the respective ones of the plurality of amplitudes.

10. The cable testing system of claim 4, wherein:
prior to the pulse generation module transmitting the first pulse, the TDR module (i) determines a current offset value based on a level of noise on the second communication channel and (ii) verifies proper operation of at least one of the first cable or the second cable based on a difference between the first amplitude and the current offset value; and
the TDR module utilizes a previously stored offset value when a difference between the current offset value and the previously stored offset value is greater than a rejection threshold.

11. The cable testing system of claim 1, further comprising a timer, wherein:
the TDR module resets the timer when the pulse generation module transmits the first pulse;
the pulse generation module transmits a subsequent pulse only subsequent to the timer expiring; and
a maximum value of the timer is based on a maximum roundtrip propagation delay along at least one of the first cable or the second cable.

12. The cable testing system of claim 1, wherein the pulse generation module:
refrains from transmitting the first pulse when the pulse generation module detects activity on at least one of the first communication channel or the second communication channel; and
refrains from transmitting the first pulse when the pulse generation module detects signal activity between communication devices on the at least one of the first communication channel or the second communication channel.

13. The cable testing system of claim 12, further comprising a first timer, wherein:
the cable testing system (i) operates in a first wait state and (ii) resets the first timer when the pulse generation module detects activity on the at least one of the first communication channel or the second communication channel; and
while the cable testing system is in the first wait state, the TDR module indicates that a current cable test failed when the first timer expires.

14. The cable testing system of claim 12 further comprising a first timer and a second timer, wherein:
the cable testing system (i) operates in a first wait state and (ii) resets the first timer when the pulse generation module detects activity on the at least one of the first communication channel or the second communication channel; and
while the cable testing system is in the first wait state, the cable testing system (i) initiates a second wait state and (ii) resets the second timer when the activity subsides on the at least one of the first communication channel or the second communication channel.

15. The cable testing system of claim 14 wherein, while the cable testing system is in the second wait state, the pulse generation module transmits the first pulse when the second timer expires.

16. The cable testing system of claim 14 wherein, while the cable testing system is in the second wait state, the cable testing system returns to the first wait state when activity reoccurs on the at least one of the first communication channel or the second communication channel.

17. The cable testing system of claim 1, wherein the cable testing system:
operates in a maximum peak mode;
detects (i) a maximum amplitude of the first reflected signal and (ii) a time of the maximum amplitude corresponding to a distance along at least one of the first cable or the second cable; and
verifies proper operation of at least one of the first cable or the second cable based on the maximum amplitude and the time.

18. The cable testing system of claim 1 wherein the cable testing system:
operates in a first peak mode;
detects an earliest occurring peak of the first reflected signal subsequent to when the first amplitude decreases by a predetermined amplitude;
detects a time of the earliest occurring peak corresponding to a distance along at least one of the first cable and the second cable; and
verifies proper operation of at least one of the first cable or the second cable based on the time.

19. The cable testing system of claim 1, wherein the cable testing system:
operates in a last peak mode;
detects a latest occurring peak of the first reflected signal subsequent to when the first amplitude decreases by a predetermined amplitude;
detects a time of the latest occurring peak corresponding to a distance along at least one of the first cable or the second cable; and
verifies proper operation of at least one of the first cable or the second cable based on the time.

20. The cable testing system of claim 1, wherein the cable testing system:
operates in an $N^{th}$ peak mode, where N is an integer greater than 1;
detects an $N^{th}$ peak of the first reflected signal subsequent to when the first amplitude decreases by a predetermined amplitude;
detects a time of the $N^{th}$ peak corresponding to a distance along at least one of the first cable or the second cable; and
verifies proper operation of at least one of the first cable or the second cable based on the time.

21. The cable testing system of claim 1, wherein:
during a cable test, the sampling module (i) detects a second amplitude of a reflected signal on the first communication channel and then (ii) detects a third amplitude of a reflected signal on the second communication channel while the pulse generation module transmits pulses on the first communication channel; and the sampling module (i) detects a fourth amplitude of a reflected signal on the first communication channel and then (ii) detects a fifth amplitude of a reflected signal on the second communication channel while the pulse generator module transmits pulses on the second communication channel.

22. The cable testing system of claim 1, wherein:

the first cable includes the first communication channel, and the second cable includes the second communication channel;

wherein the cable testing system further comprises:

a first sampling module that samples the first reflected signal at a predetermined sampling rate to detect the first amplitude on the first communication channel;

a second sampling module that samples a second reflected signal at the predetermined sampling rate to detect a second amplitude of the second reflected signal on the second communication channel, wherein the first sampling module detects the first amplitude while the second sampling module detects the second amplitude, and wherein the second reflected signal is a reflected version of the first pulse.

* * * * *